April 14, 1959 J. H. WERNICK 2,882,194

SEMICONDUCTING MATERIALS AND DEVICES MADE THEREFROM

Filed May 10, 1957

INVENTOR
J. H. WERNICK

BY

George S. Indig

ATTORNEY

United States Patent Office 2,882,194

Patented Apr. 14, 1959

2,882,194

SEMICONDUCTING MATERIALS AND DEVICES MADE THEREFROM

Jack H. Wernick, Morristown, N.J., assignor to Bell Telephone Laboratories, Incorporated, New York, N.Y., a corporation of New York Application May 10, 1957, Serial No. 658,438

8 Claims. (Cl. 148—33)

This invention relates to ternary semiconductive compounds and to semiconductive devices containing such compounds.

In accordance with this invention it has been discovered that two ternary compounds $CuSbS_2$ and $AgBiS_2$ manifest both intrinsic and extrinsic semiconductive properties. It has been discovered that these materials may be modified by the introduction of small amounts of significant impurities so as to result in the inclusion therein of one or more p-n junctions.

These two compounds are discussed herein in terms of their electrical and physical properties and their use in a junction-type transducing device. Although both of these materials are known to occur naturally, considerations relative to supply, impurity content and crystallinity have led to the development of a method of synthesis. A method by which each of these materials has been synthesized is described.

Figure 1:
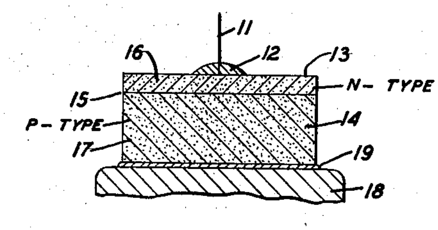
Figure 2:
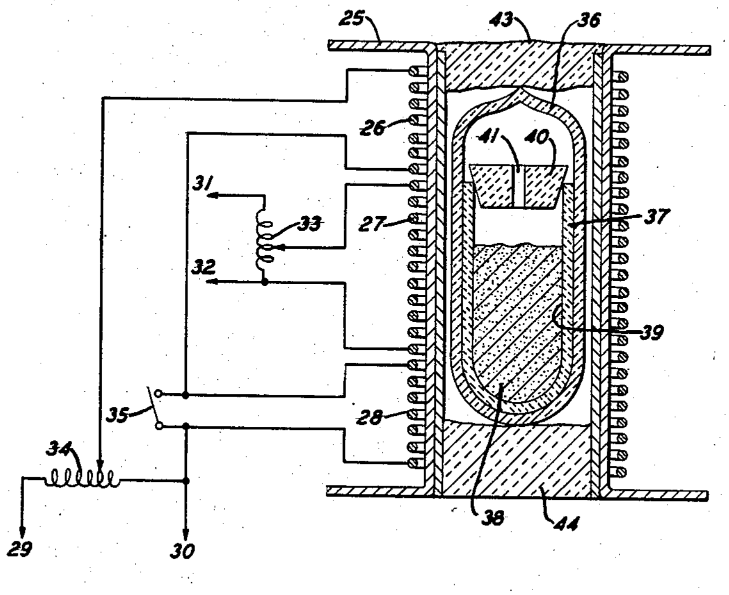

The invention may be more easily understood by reference to the following figures in which:

Fig. 1 is a schematic front elevational view in section of a junction-type diode utilizing one of the compounds herein; and Fig. 2 is a schematic cross-sectional view of apparatus used in the preparation of each of the compounds of this invention.

Referring again to Fig. 1, the device depicted is a junction-type diode consisting of electrode 11 making ohmic connection 12 with surface 13 of block 14 which may, for example, be $CuSbS_2$ and which block contains p-n junction 15 between region 16 which is of one conductivity type and region 17 which is of the opposite conductivity type. Electrode 18 makes ohmic contact with semiconductor block 14 by means, for example, of a solder joint 19. Since $CuSbS_2$ manifests p-type conductivity as synthesized, where block 13 is made of such material, region 17 may constitute the unconverted material and, therefore, be of p-type conductivity while region 16 of n-type conductivity may be produced, for example, by doping with a significant impurity such as iodine from Group VII of the periodic table according to Mendeleyeev.

In view of the present stage of development of the semiconductor device art and the ready availability of information relative to contacting media and other design criteria, it is not considered that a discussion of such matter is necessary to a description of this invention. It is noted, however, that solder joint 19 making ohmic connection to block 14 may contain a material having an excess of electrons where the region contacted is of n-type conductivity and a deficiency of electrons when the material contacted is of p-type conductivity.

Fig. 2 depicts one type of apparatus found suitable for the preparation of each of the two semiconductive compounds herein. Reference will be made to this figure in the examples relating to the actual preparation of these compounds. The apparatus of this figure consists of a resistance wire furnace 25 containing three individual windings 26, 27 and 28 as indicated schematically, these windings comprising turns of platinum-20 percent rhodium resistance wire. In operation, an electrical potential is applied across terminals 29 and 30 and also across terminals 31 and 32 by means not shown. The amount of current passing through resistance winding 27 is controlled by means of an autotransformer 33 while the amount of current supplied to windings 26 and 28 is controlled by autotransformer 34, so that the temperature of the furnace within winding 27 may be controlled independently of the temperature in the furnace within windings 26 and 28. Switch 35 makes possible the shunting of winding 28 while permitting current to pass through winding 26. The functions served by autotransformers 33 and 34 and switch 35 are explained in conjunction with the general description of the method of synthesis.

Within furnace 25 there is contained sealed container 36 which may be made of silica and may, for example, be of an inside diameter of the order of 19 millimeters within which there is sealed a second silica crucible 37 containing the component materials 38 used in the synthesis of a compound of this invention. Coating 39 on the inner surface of crucible 37 may be of a material such as carbon and has the effect of reducing adhesion between surface 39 and the final compound. Inner crucible 37 is closed at its upper end with graphite cap 40 having hole 41 so as to prevent possible boiling over into container 36 and to minimize heating of charge during sealing off of container 36. In the synthesis of the materials herein thermal losses are reduced and temperature control gained by use of insulation layers 43 and 44 which may, for example be Sil-o-cell refractory.

The following is a general outline of a method of preparation used in synthesis of the compounds of this invention. Reference will be had to this general outline in Examples 1 and 2 each of which sets forth the specific starting materials and conditions of processing utilized in the preparation of a compound herein.

The charge was placed in crucible 37 which was then stoppered with cap 40 and placed within container 36. Outer container 36 was then evacuated, filled with tank nitrogen at a pressure of two-thirds of an atmosphere and was sealed and placed within furnace 25. With switch 35 open, an electrical potential was then applied across terminals 29 and 30 and also terminals 31 and 32, and autotransformers 33 and 34 were adjusted so as to result in a temperature in the central portion of the furnace of from about 650° C. to about 750° C. and preferably about 680° C. and so as to result in furnace temperatures within windings 26 and 28 of from about 75° C. to about 100° C. higher than that of the central portion of the furnace. The upper and lower portions of the furnace were maintained at the higher temperature to prevent dynamic loss by vaporization and condensation of vaporizable constituents.

The furnace was maintained at the temperatures and gradients indicated in the paragraph preceding for a period of about two hours after which power to terminals of 31 and 32 was terminated and switch 35 was closed so as to shunt winding 28, thus creating a temperature gradient with the high end of the gradient at the top of the furnace and the low end of the gradient at the bottom of the furnace as the melt cooled. Under the conditions indicated the temperature gradient was from a high of about 700° C. to a low of about 450° C. This gradient was maintained for a period of about one hour after which the current was turned off and the melt permitted to return to room temperature.

Heating of the furnace was gradual taking about three hours from room temperature to the high temperature of about 700° C. so that the major portion of the alloying was carried out over a range of temperature at which the vapor pressure of sulfur is relatively low, thereby minimizing loss of this vaporizable material. Microscopic examination and thermal analysis showed that the compounds were single phase. Other characteristics are reported in the examples which follow:

*Example 1*

$CuSbS_2$ was prepared in accordance with the above outline using a mixture of 19.07 grams of copper, 36.53 grams of antimony and 19.26 grams of sulfur. These materials were thoroughly mixed with a spatula before being placed in crucible 37. The final ingot was single phase, had a melting point of 535° C., an energy gap of about 0.8 electron volt and evidenced p-type conductivity.

*Example 2*

$AgBiS_2$ was prepared as above using a starting charge of 13.49 grams of silver, 26.13 grams of bismuth and 8.025 grams of sulfur. The final material was single phase, evidenced n-type conductivity and had a melting point of 750° C.

In both of the examples above, it was found that particle size of starting constituents was not critical. Actual particle sizes used varied from about 0.1" to about 0.5".

Each of the compounds of this invention manifests either hole or electron conductivity and is, therefore, an extrinsic semiconductor as made. That the conductivity characteristics of these compounds are at least in part extrinsic and due to the inclusion of significant impurities is evidenced by the difference in resistivity between the relatively impure naturally occurring compounds and the relatively pure synthesized compounds.

The conductivity type of compounds of this invention has been successfully converted by the use of small amounts of doping elements. In accordance with conventional doping theory the conductivity type of either of the ternary compounds herein may be caused to approach n-type material by substitution of any one of the elements of the compound by any element having a larger number of electrons in its outer ring and may be caused to approach p-type by such substitution with an element having a smaller number of such electrons. The determination of practical significant impurities additionally depends upon physical and chemical characteristics which will permit such substitution without appreciably affecting the crystallography and the chemical composition of the compound. A substantial amount of study has been given these considerations in the field of doping of semiconductive materials in general and criteria upon which an accurate prediction may be premised are available in the literature, see for example, L. Pincherle and J. M. Radcliffe, Advances in Physics, volume 5, number 19, July 1956, page 271. In general, it has been found that if the extrinsic element so chosen is chemically compatible with both the compound and the atmosphere to which the compound is exposed during high temperature processing, this element, if it has an atomic radius which is fairly close to that of one of the elements of the ternary compound, will seek out a vacancy in the lattice and will occupy a site corresponding with that of that element of the compound. Doping may be effected also by introduction of small atoms which appear to occupy interstitial positions as, for example, lithium in germanium and hydrogen in zinc oxide.

In accordance with the above, it has been found that iodine from Group VII of the periodic table having a radius of 1.33 A. will readily occupy a sulfur site in either of the compounds of this invention and thereby act as a significant impurity inducing n-type conductivity. Sulfur is an element from the sixth group of the periodic table and has a radius of 1.04 A. Other elements from the seventh group of the periodic table have a similar effect. It has been found that chlorine, for example, having a radius of 0.99 A. also substitutes for sulfur and induces n-type conductivity although it is not generally considered to be desirable significant impurity since it is extremely reactive with moisture, and precautions must be taken to keep the atmosphere dry during the introduction. Starting with $CuSbS_2$ which exhibits p-type conductivity as made, p-n junctions have been produced by diffusing iodine into the solid material. Such p-n junctions have exhibited rectification properties. Manganese having an atom radius of 1.17 A. is also effective as a donor.

In common with experience gained from studies conducted on other semiconductor systems, it is found that addition of impurities in amounts of over about 1 percent by weight may result in degenerate behavior. Amounts of significant impurity which may be tolerated are generally somewhat lower and are of the order of 0.01 atomic percent. However, it is not to be inferred from this observation that semiconductor devices of this invention must necessarily contain 99 percent or more of a particular semiconductive compound disclosed herein. It is well established that desirable semiconductive properties may be gained by the combination of two or more semiconductive materials, for example, for the purpose of obtaining a particular energy gap value. For this reason, therefore, it is to be expected that either of the compounds herein may be alloyed with the other or with any other semiconductive material without departing from the scope of this invention.

This invention is directed to semiconductor systems utilizing one or both of the compounds $CuSbS_2$ and $AgBiS_2$ and to devices utilizing such systems.

Although the invention has been described primarily in terms of specific doping elements and specific devices, it is to be expected that the wealth of information gained through studies conducted on other semiconductor systems may be used to advantage in conjunction with this invention. Refining and processing methods, as also diffusion and alloying procedures and other treatment known to those skilled in the art, may be used in the preparation of materials and devices utilizing the compounds herein, without departing from the scope of this invention. Other device uses for the compounds herein are also known.

What is claimed is:

1. A semiconductor system containing a compound selected from the group consisting of $CuSbS_2$ and $AgBiS_2$ and a significant impurity in an amount of up to 0.01 atomic percent of the said compound.

2. The semiconductor system of claim 1 containing at least 99 percent by weight of the said compound.

3. The semiconductor system of claim 1 in which the significant impurity is an element of Group VII of the periodic table in accordance with Mendelyeev.

4. The semiconductor system of claim 3 in which the significant impurity is iodine.

5. The semiconductor system of claim 1 in which 99 percent by weight of the material therein contained other than the said compound and the said significant impurity exhibits semiconducting properties.

6. A semiconductor transducing device comprising a body consisting essentially of a compound selected from the group consisting of $CuSbS_2$ and $AgBiS_2$, said body containing at least one p-n junction.

7. The device of claim 6 in which the said compound is $CuSbS_2$.

8. The device of claim 6 in which the said compound is $AgBiS_2$.

References Cited in the file of this patent

FOREIGN PATENTS 1,120,304 France ---------------- Apr. 16, 1956

OTHER REFERENCES

Mellor: A Comprehensive Treatise on Inorganic and Theoretical Chemistry, London, 1923, Longmans, Green and Company, vol. 3, page 7.